United States Patent [19]

Nakamura

[11] Patent Number: 5,334,547
[45] Date of Patent: Aug. 2, 1994

[54] METHOD OF MANUFACTURING A SEMICONDUCTOR MEMORY HAVING AN INCREASED CELL CAPACITANCE IN A RESTRICTED CELL AREA

[75] Inventor: Kunio Nakamura, Tokyo, Japan

[73] Assignee: NEC Corporation, Japan

[21] Appl. No.: 911,348

[22] Filed: Jul. 8, 1992

Related U.S. Application Data

[60] Division of Ser. No. 790,140, Nov. 7, 1991, abandoned, which is a continuation of Ser. No. 457,286, Dec. 27, 1989, abandoned.

[30] Foreign Application Priority Data

Dec. 27, 1988 [JP] Japan ................. 63-331716

[51] Int. Cl.$^5$ ............................. H01L 21/70
[52] U.S. Cl. ............................. 437/52; 437/35; 437/38; 437/47; 437/60
[58] Field of Search ............. 357/23.6; 437/38, 47, 437/48, 52, 35, 60, 203

[56] References Cited

U.S. PATENT DOCUMENTS

| | | | |
|---|---|---|---|
| 4,355,374 | 10/1982 | Sakai et al. | 357/23.6 |
| 4,742,018 | 5/1988 | Kimura et al. | 357/23.6 |
| 4,745,454 | 5/1988 | Erb | 357/23.6 |
| 4,794,563 | 12/1988 | Maeda | 357/23.6 |
| 4,845,544 | 7/1989 | Shimizu | 357/23.6 |
| 4,888,628 | 12/1989 | Bergemont | 357/23.6 |
| 5,013,673 | 5/1991 | Fuse | 437/35 |
| 5,047,359 | 10/1991 | Nagatomo | 437/35 |

FOREIGN PATENT DOCUMENTS

| | | | |
|---|---|---|---|
| 0085988 | 8/1983 | European Pat. Off. | 437/23.6 |
| 0194682 | 9/1985 | European Pat. Off. | |
| 0223616 | 5/1987 | European Pat. Off. | |
| 0287056 | 10/1988 | European Pat. Off. | |
| 60-128658 | 7/1985 | Japan | 357/23.6 G |
| 2114814 | 8/1983 | United Kingdom | |

Primary Examiner—Tom Thomas
Attorney, Agent, or Firm—Ostrolenk, Faber, Gerb & Soffen

[57] ABSTRACT

A semiconductor memory includes at least one memory cell composed of an insulated gate field effect transistor and an associated stacked capacitor which are formed close to each other on a single substrate of a first conduction type. The insulated gate field effect transistor has a source and a drain which are located separately from each other in the single substrate and formed of impurity regions of a second conduction type opposite to the first conduction type. The insulated gate field effect transistor also has a gate formed through a gate insulator on a region between the source and the drain. The gate and the source of the insulated gate field effect transistor are connected to a word line and a bit line, respectively, and the drain of the insulated gate field effect transistor is connected to a first electrode of the stacked capacitor. The memory cell also comprises a first impurity region of the first conduction type formed in the substrate below the stacked capacitor, and a second impurity region of the second conduction type which is formed above the first impurity region in the substrate below the stacked capacitor and which has a junction depth shallower than the depth of the first impurity region, so that a pn junction is formed between the first impurity region and the second impurity region. The second impurity region is connected to the first electrode of the stacked capacitor. With this arrangement, the memory cell has a cell capacitance of based on a sum of a capacitance of the stacked capacitor and a junction capacitance of the pn junction.

3 Claims, 8 Drawing Sheets

METHOD OF MANUFACTURING A SEMICONDUCTOR MEMORY HAVING AN INCREASED CELL CAPACITANCE IN A RESTRICTED CELL AREA

This is a Divisional application of Ser. No. 07/790,140, filed on Nov. 7, 1991, now abandoned, which is a continuation application of application Ser. No. 07/457,286, filed on Dec. 27, 1989, now abandoned.

BACKGROUND OF THE INVENTION

1. Field of the Invention

The present invention relates to a semiconductor memory, and more specifically to a semiconductor memory composed of single-transistor memory cells.

2. Description of Related Art

At present, semiconductor memories composed of single-transistor memory cells each consisting of one transistor and an associated capacitor for forming one information storing unit, have been the most widely utilized. In this type of semiconductor memory, if a transistor and an associated capacitor are formed in the same plane, the size of one memory cell becomes too large. Therefore, in order to miniaturize the memory cells so as to increase the density of the semiconductor memory, a so called stacked memory cell has been proposed and reduced to practice. In the stacked memory cell, an electric charge storage capacitor is formed by stacking two or more conducting layers in such a manner that an insulating film is sandwiched between each pair of adjacent conducting layers.

In order to further miniaturize the stacked memory cells, it has been an ordinary practice to make the insulating layer of the stacked capacitor as thin as possible with the intention of preventing a capacitance decrease of the memory cell caused by a decrease in area of the capacitor. However, the thinning of the insulating layer of the stacked capacitor has resulted in increased numbers of pin holes and a decrease in the voltage that can be withstood, and therefore, in a decrease in reliability.

SUMMARY OF THE INVENTION

Accordingly, it is an object of the present invention to provide a semiconductor memory which has overcome the above mentioned defect of the conventional one.

Another object of the present invention is to provide a semiconductor memory of the single-transistor type having a large cell capacitance in a restricted cell area.

A further object of the present invention is to provide a semiconductor memory of the single-transistor type having an additional capacitance, in addition to a stacked capacitor.

The above and other objects of the present invention are achieved in accordance with the present invention by a semiconductor memory including at least one memory cell composed of an insulated gate field effect transistor and an associated stacked capacitor which are formed close to each other on a single substrate of a first conduction type, the insulated gate field effect transistor having a source and a drain which are located separately from each other in the single substrate and formed of impurity regions of a second conduction type opposite to the first conduction type, the insulated gate field effect transistor also having a gate formed through a gate insulator on a region between the source and the drain, the gate and the source of the insulated gate field effect transistor being connected to a word line and a bit line, respectively, the drain of the insulated gate field effect transistor being connected to one electrode of the stacked capacitor, wherein the improvement comprises a first impurity region of the first conduction type formed in the substrate below the stacked capacitor, and a second impurity region of the second conduction type which is formed above the first impurity region in the substrate below the stacked capacitor and which has a junction depth shallower than the depth of the first impurity region, so that a pn junction is formed between the first impurity region and the second impurity region, the second impurity region being connected to the one electrode of the stacked capacitor, whereby the memory cell has a cell capacitance of a sum of a capacitance of the stacked capacitor and a junction capacitance of the pn junction.

As seen from the above, the semiconductor memory in accordance with the present invention is characterized by the provision, in addition to the stacked capacitor, of a pn junction capacitor formed within the substrate by the first impurity region of the first conduction type and the second impurity region of the second conduction type. Therefore, the memory cell of the semiconductor memory in accordance with the present invention can have a cell capacitance larger than the conventional stacked memory cell having the same chip area, without further thinning the insulating layer of the stacked capacitor, and therefore, without decrease of the withstand voltage and the reliability. From another viewpoint, the memory cell of the semiconductor memory in accordance with the present invention can be formed with a chip area smaller than the conventional stacked memory cell having the same cell capacitance, without further thinning the insulating layer of the stacked capacitor, and therefore, without decrease of the withstand voltage and the reliability.

In one modification of the semiconductor memory in accordance with the present invention, a trench is formed into the substrate under the stacked capacitor. The first impurity region of the first conduction type and the second impurity region of the second conduction type are respectively formed to extend over a sidewall and a bottom of the trench, so that the pn junction between the first impurity region and the second impurity region extends over the sidewall and the bottom of the trench. With the arrangement, a large pn junction capacitance is obtained. More preferably, the stacked capacitor enters or extends into the trench, so that stacked capacitor itself can have an increased capacitance.

The above and other objects, features and advantages of the present invention will be apparent from the following description of preferred embodiments of the invention with reference to the accompanying drawings.

DESCRIPTION OF THE PREFERRED EMBODIMENTS

Figure 1:
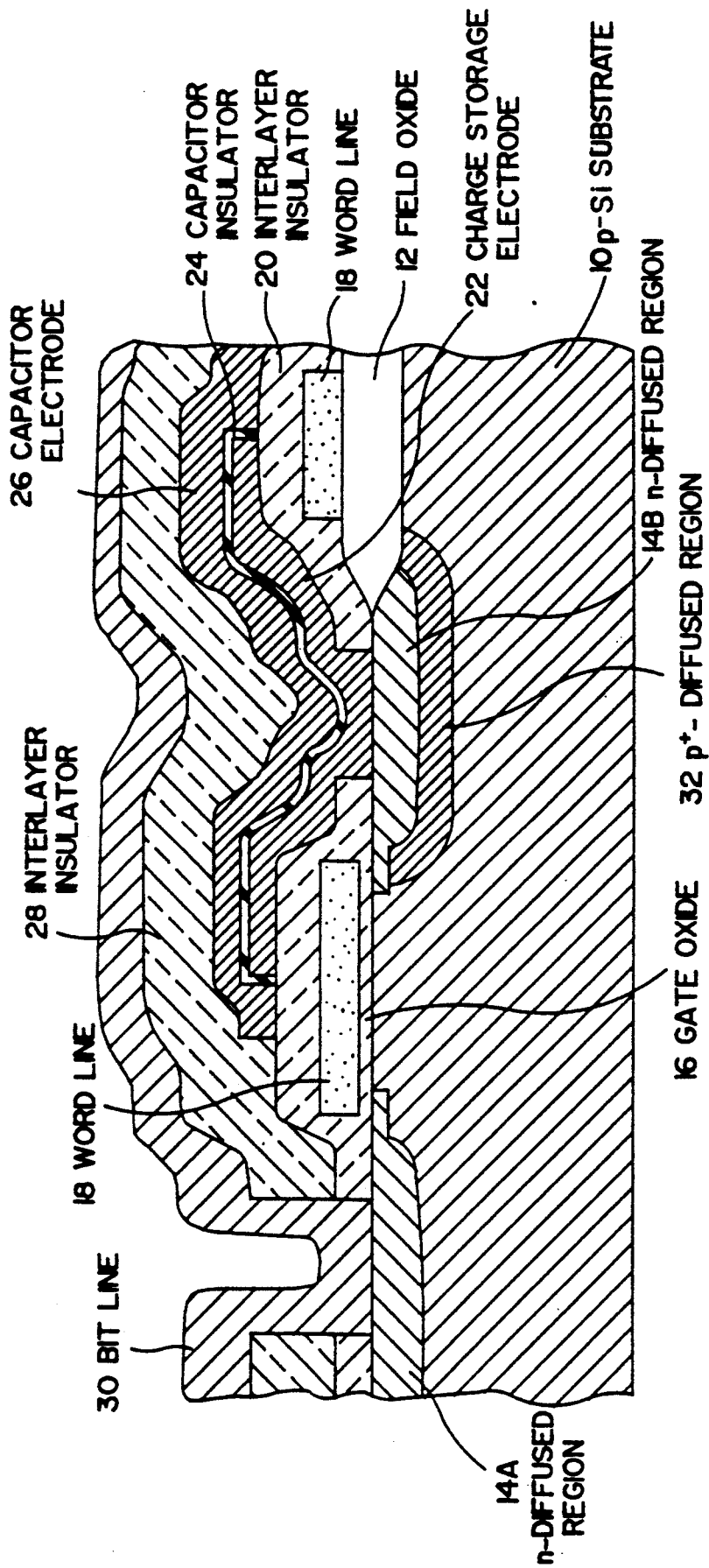
FIG. 1 is a diagrammatic sectional view of an embodiment of the single-transistor memory cell in accordance with the present invention.

Referring to FIG. 1, there is shown a diagrammatic sectional view of an embodiment of the single-transistor memory cell in accordance with the present invention. The shown single-transistor memory includes a p-type silicon substrate 10 having a field oxide 12 of about 0.5 μm formed on a principal surface thereof to surround and define individual device formation zones, respectively. In the device formation zone shown in FIG. 1, n-diffused regions 14A and 14B are formed in the principal surface of the substrate 10, separately from each other. The n-diffused region 14A forms a source region and the n-diffused region 14B forms a drain region. On the principal surface of the substrate 10 between the n-diffused regions 14A and 14B, a gate oxide 16 is formed, and a word line 18 is formed on the gate oxide 16 and the field oxide 12. For example, this word line 18 is formed of a polycrystalline silicon having a thickness of about 0.3 μm, and extends in a direction perpendicular to the plane of the drawing. A portion of the word line 18 positioned between the n-diffused regions 14A and 14B acts as a gate electrode.

In addition, a low level interlayer insulator 20 is deposited to cover the word lines 18 and the surface of the substrate 10. A contact hole is formed through a portion of the interlayer insulator 20 above the n-diffused region 14B forming the drain region, and a charge storage electrode 22 is deposited in ohmic contact with the n-diffused region 14B through the contact hole and to extend on the interlayer insulator 20 so as to cover a half or more of the word lines 18. A capacitor insulator 24 is also deposited to completely cover the charge storage electrode 22, and a capacitor electrode 26 is formed to completely cover the capacitor insulator 24. Thus, a stacked capacitor composed of the charge storage electrode 22, the capacitor insulator 24 and the capacitor electrode 26 and connected to the n-diffused region 14B is formed above the n-diffused region 14B.

Furthermore, an upper level interlayer insulator 28 is deposited to cover the overall main principal surface of the substrate, and a contact hole is formed through a portion of the lower level and upper level interlayer insulators 20 and 28 above the n-diffused region 14A forming the source region. A bit line 30 is formed in ohmic contact with the n-diffused region 14A through the contact hole and to extend over the upper level interlayer insulator 28. This bit line 30 extends in a direction orthogonal to the word lines 18.

Thus, an insulated gate field effect transistor is formed of the n-diffused region 14A, the n-diffused region 14B and the word line 18 between the n-diffused region 14A and the n-diffused region 14B. This field effect transistor functions as a transfer gate between the bit line 30 and the stacked capacitor, namely, a switching element for charging and discharging the stacked capacitor from the bit line 30.

In addition, and in accordance with the present invention, a p+-diffused region 32 is formed to extend under the n-diffused region 14B forming the drain region, so that a pn junction capacitor is formed between the n-diffused region 14B and the p+-diffused region 32. This p+-diffused region 32 has an impurity concentration higher than that of the substrate 10. For example, the p+-diffused region 32 has 100 times or more the impurity concentration of the substrate 10. Since the n-diffused region 14B is connected to the charge storage electrode 22 of the stacked capacitor, this pn junction capacitor is in parallel to the stacked capacitor. Accordingly, the single-transistor memory cell shown has a cell capacitance which corresponds to a sum of a capacitance of the stacked capacitor and a capacitance of the pn junction capacitor.

Now, explanation will be made of a process for manufacturing the above mentioned memory cell, with reference to FIGS. 2 to 5.

Figure 2:
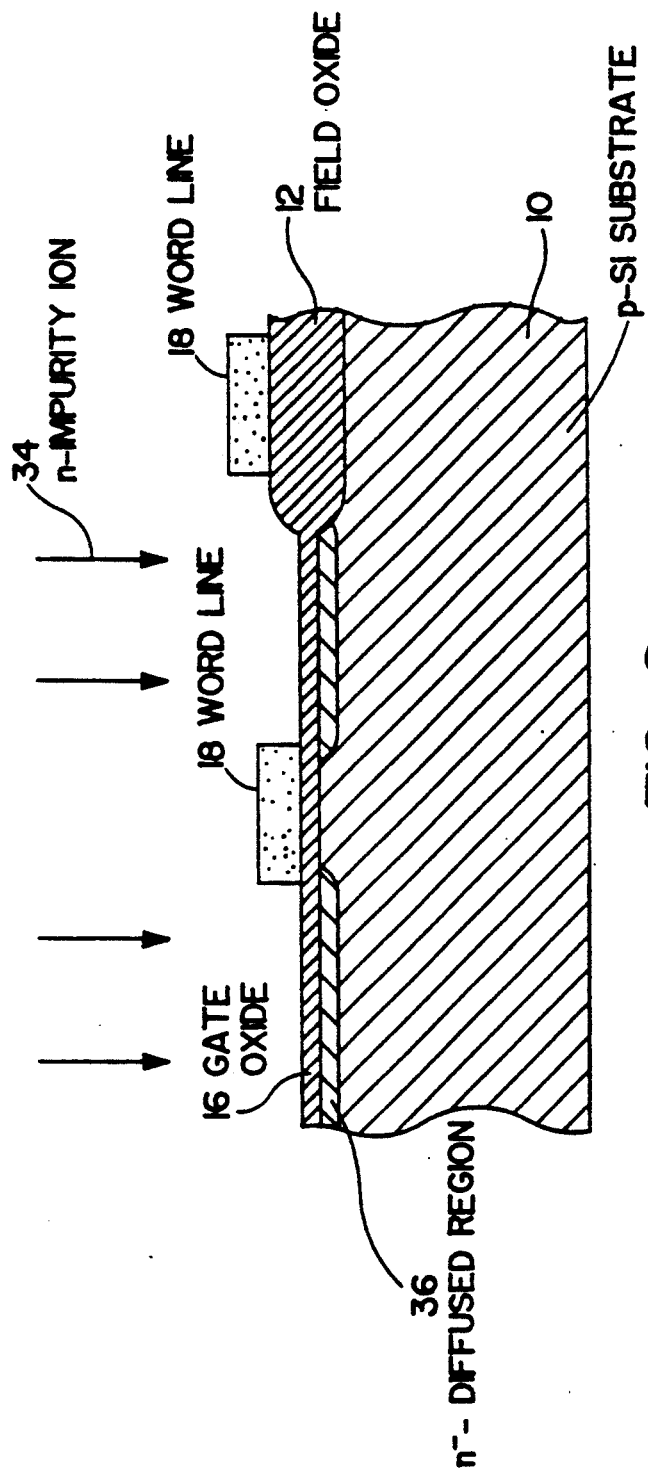
FIGS. 2 to 5 are diagrammatic sectional views illustrating some steps for manufacturing the single-transistor memory cell shown in FIG. 1.

As shown in FIG. 2, the field oxide 12 having a thickness of about 0.5 μm is formed on the main principal surface of the p-type silicon substrate 10 by means of an ordinary LOCUS (local oxidation of silicon) process. The gate oxide 16 of 100 to 200 Å thickness is formed to cover all the main principal surface of the p-type silicon substrate 10. Thereafter, a polycrystalline silicon layer of 2000 to 3000 Å thickness is deposited on the gate oxide 16, and patterned by a photolithography process so as to form the word line or gate electrode 18. By using the word line 18 and the field oxide 12 as a mask, n-type impurities 34 are ion-implanted so as to form an n-diffused region 36 for formation of an LDD (lightly doped drain) structure. For example, $^{31}P+$ (phosphorus) ions are implanted with a dose of $5 \times 10^{12}$ to $5 \times 10^{13}$/cm$^2$ under an acceleration energy of 30 to 50 KeV.

Figure 3:
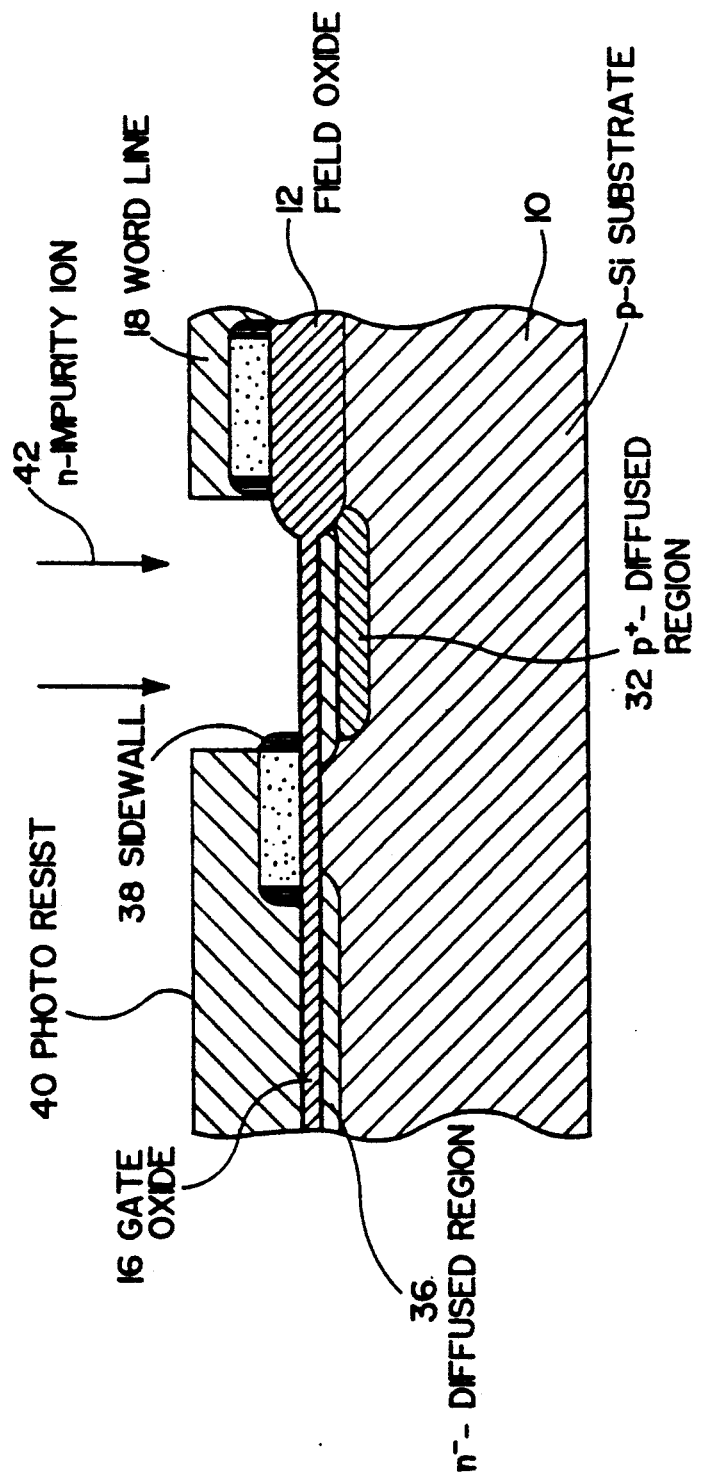

As shown in FIG. 3, a sidewall 38 is formed on each side of the word line or gate electrode 18. For example, this sidewall 38 is formed by forming an oxide layer of 1000 to 3000 Å thickness on a whole surface of the substrate 10, and etching back the formed oxide layer by a reactive ion etching, so that the oxide remains on only each side of the gate electrode 18.

Thereafter, a photoresist 40 is deposited and patterned to cover the surface of the substrate 10 excluding a future capacitor contact, and p-type impurities 42 are ion-implanted using the photoresist 40 as a mask, so as to form the p+-diffused region 32. For example, $^{11}B+$(boron) ions are implanted with a dose of $10^{12}$ to $10^{13}$/cm$^2$ under an acceleration energy of 50 to 100 KeV.

Figure 4:
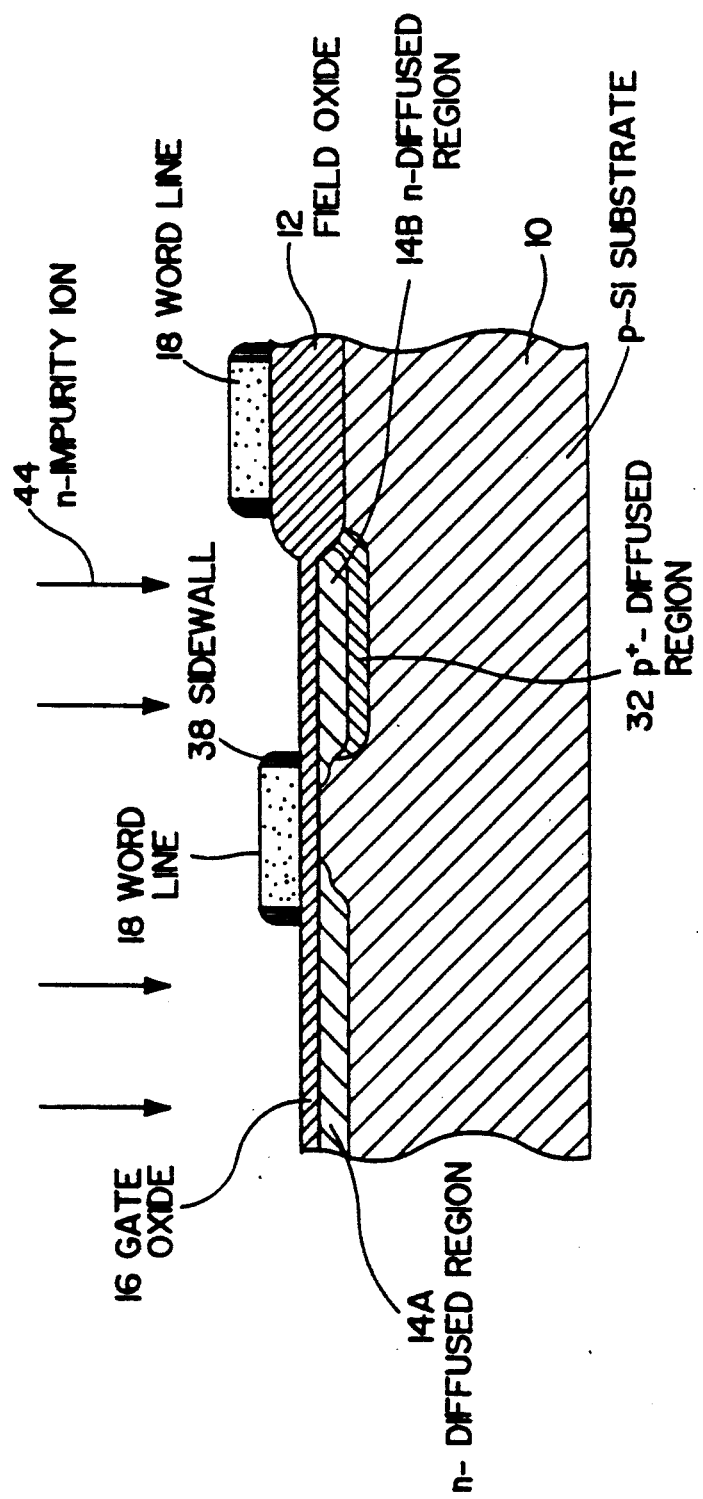

As shown in FIG. 4, arsenic ions 44 are implanted so as to form the source diffused region 14A and the drain diffused region 14B. Thus, the LDD structure is formed by action of the sidewalls 38.

Figure 5:
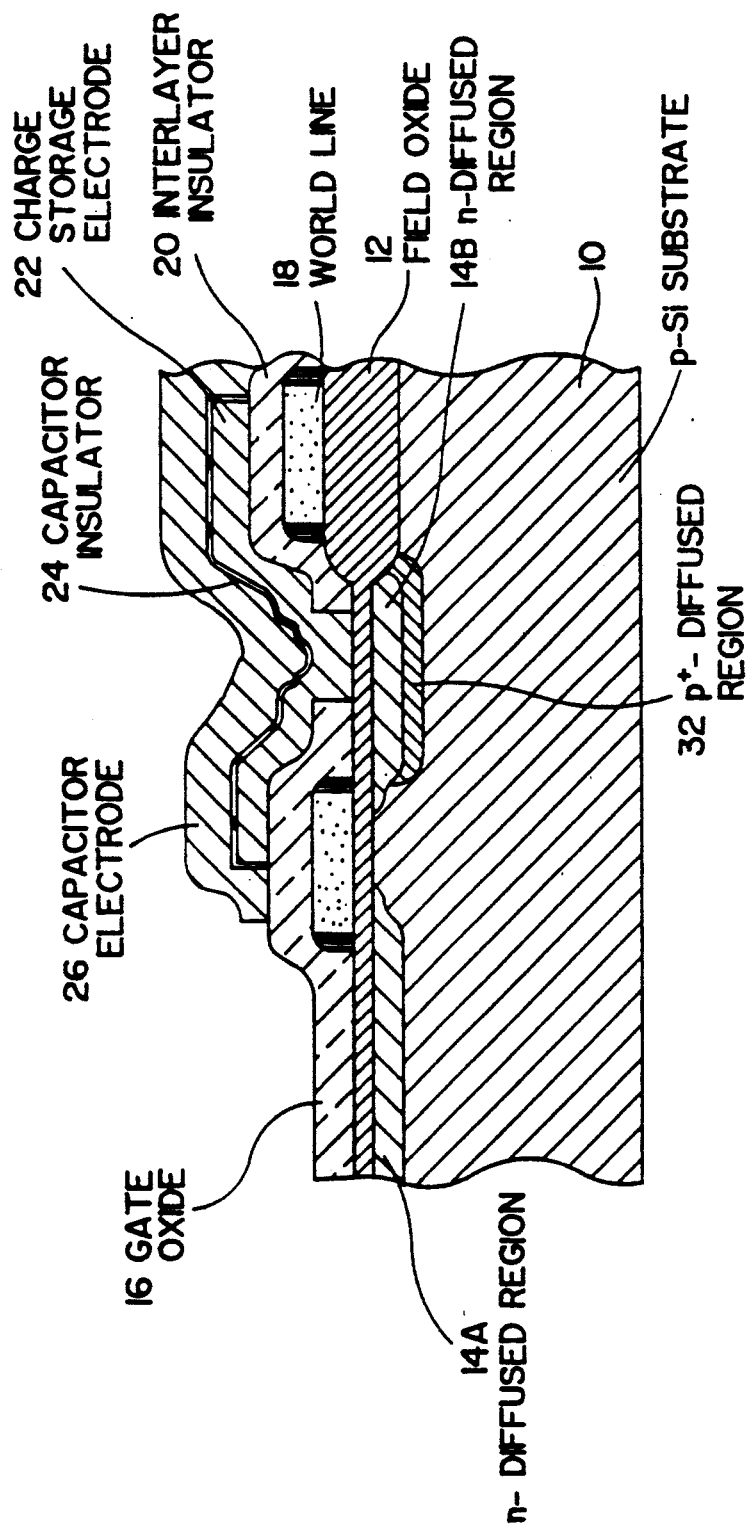

Thereafter, as shown in FIG. 5, the interlayer insulator 20 is formed and patterned so that a capacitor contact hole is formed to expose a center portion of the drain diffused region 14B. A polycrystalline silicon layer of 2000 to 4000 Å is deposited and patterned by a photolithography process to form the charge storage electrode 22.

Then, the capacitor insulator 24 is formed. This capacitor insulator 24 is preferably formed of a double or triple layer structure composed of $SiO_2$ and $Si_3N_4$. An appropriate thickness of the capacitor insulator 24 is 50 to 100 Å in conversion of oxide layer.

Furthermore, a polycrystalline silicon layer of about 3000 Å is deposited and patterned by a photolithography process to form the capacitor electrode 26.

Thereafter, the upper level interlayer insulator 28 is deposited, and a contact hole is formed for the bit line 30. The bit line 30 is formed so as to complete the structure shown in FIG. 1.

Figure 6:
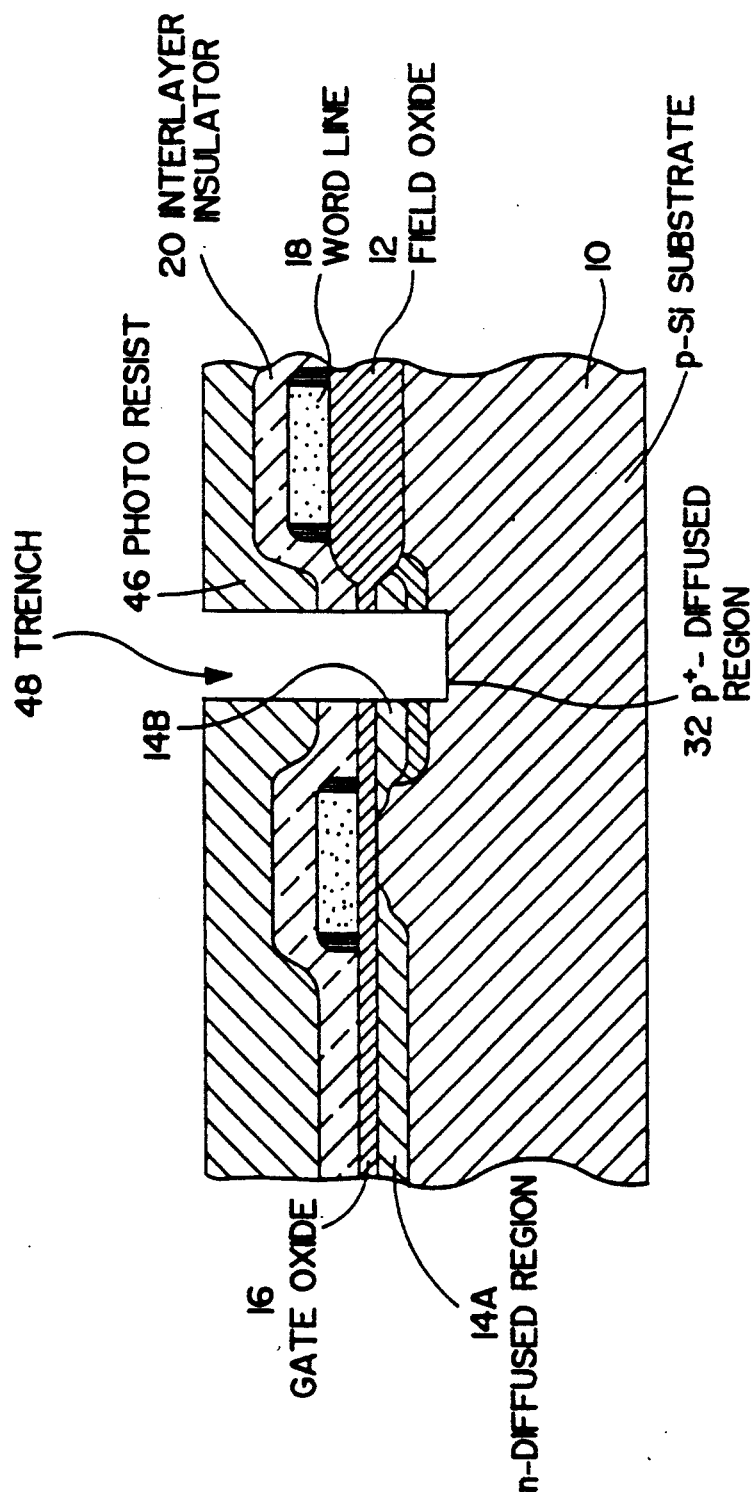
FIGS. 6 to 8 are diagrammatic sectional views illustrating some steps for manufacturing a second embodiment of the single-transistor memory cell in accordance with the present invention.
Figure 7:
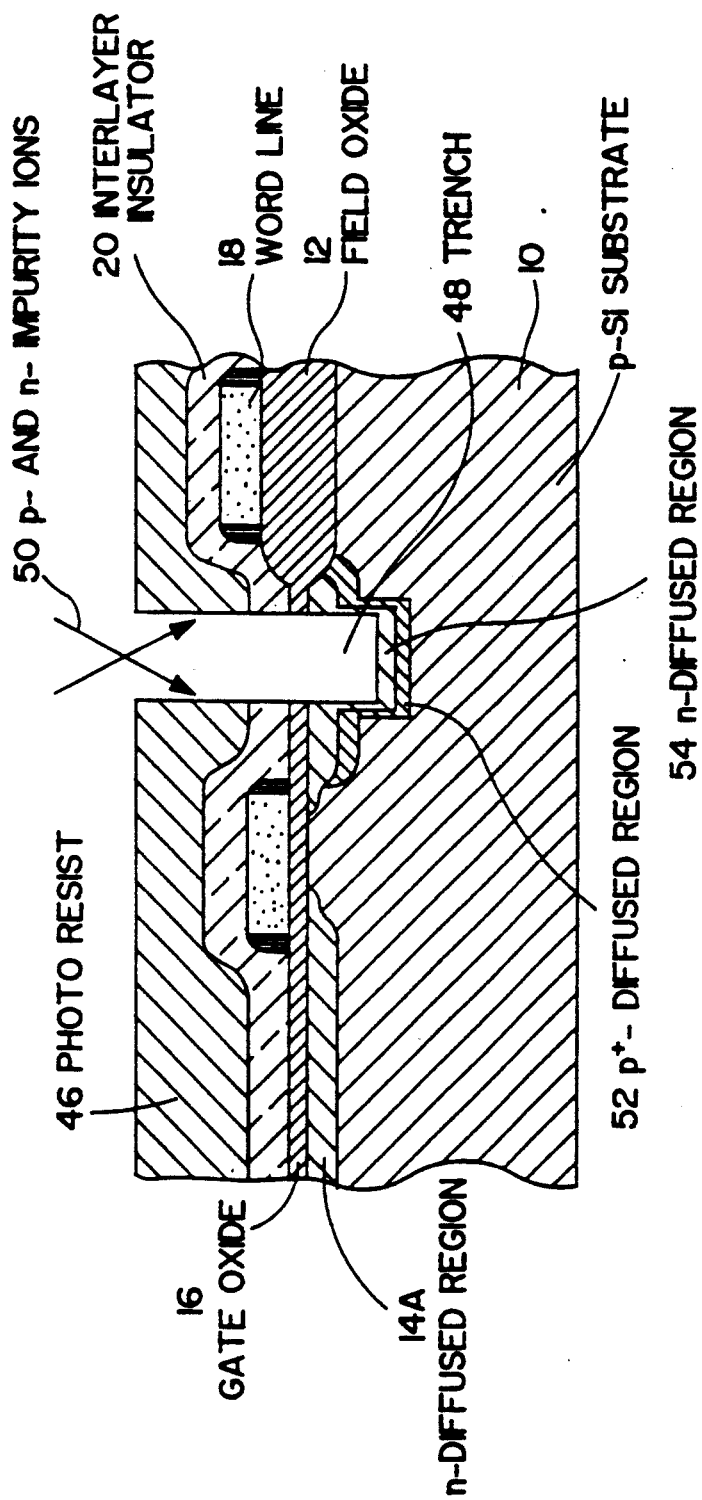
Figure 8:
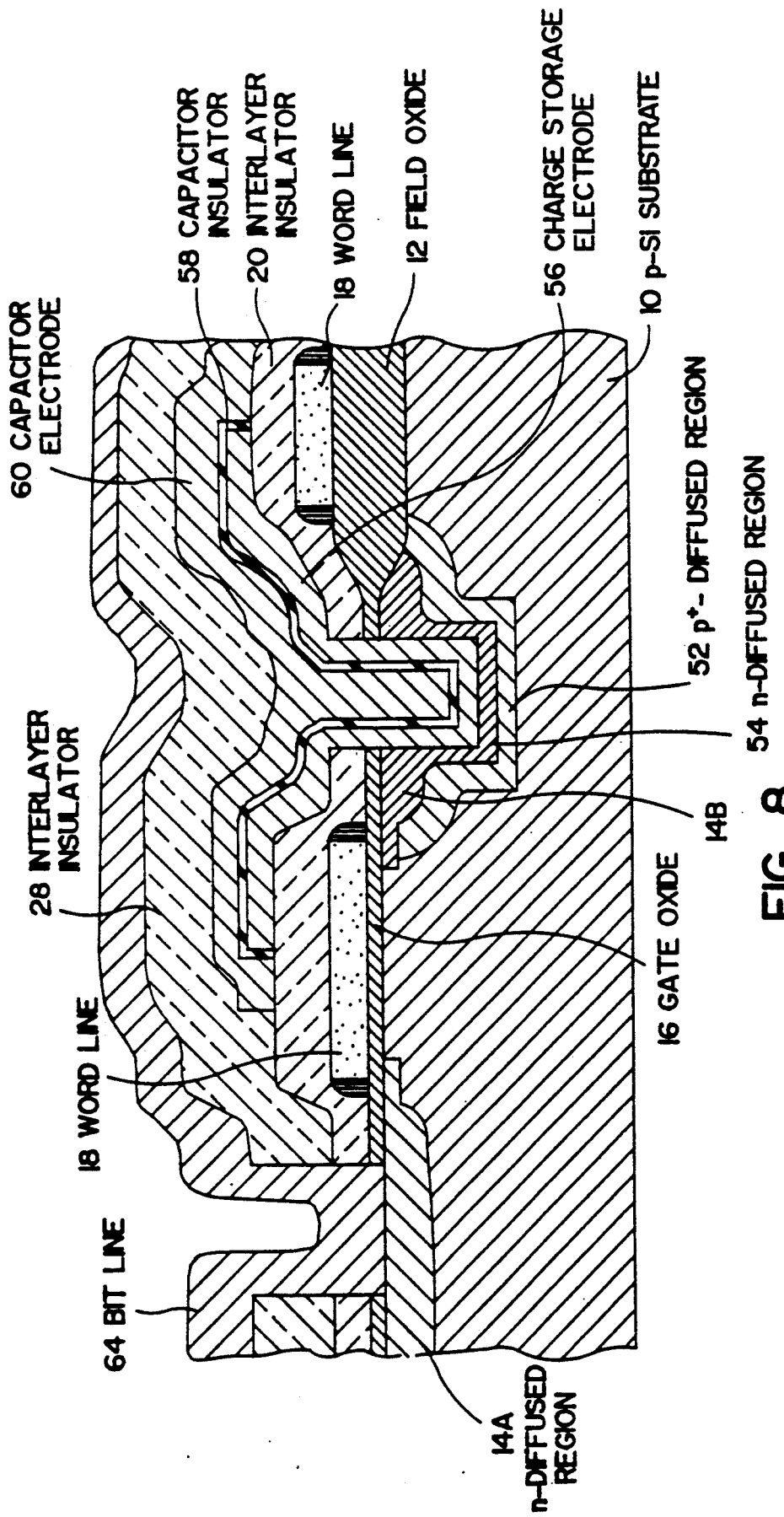

Referring to FIGS. 6 to 8, there are shown diagrammatic sectional views illustrating some steps for manufacturing a second embodiment of the single-transistor memory cell in accordance with the present invention.

FIG. 6 shows a condition in which after the source diffused region 14A and the drain diffused region 14B are formed as shown in FIG. 4, the lower level interlayer insulator 20 is formed and a patterned photoresist 46 having an aperture above the n-diffused region 14B is formed to cover the lower level interlayer insulator 20, and then, the substrate is etched by using the photoresist 46 as a mask so that a trench 48 is formed to penetrate through the lower level interlayer insulator 20, the n-diffused region 14B and the p+-diffused region 32 into the p-type substrate 10.

Thereafter, as shown in FIG. 7, p-type impurities and n-type impurities are sequentially ion-implanted to a side surface and a bottom surface of the trench 48, respectively. In order to implant ions to the side surface and the bottom surface of the trench 48, a so called "rotating inclined ion implantation" is used in which, on the one hand an ion beam is directed at an angle to a wafer, and on the other hand, the wafer is rotated. An inclined angle defined by the ion beam with respect to a direction perpendicular to the wafer is preferred to be 10° to 15°. By making the acceleration energy for the p-type impurities higher than that for the n-type impurities, a p+-diffused region 52 is formed to extend over the side surface and the bottom surface of the trench 48 and to adjoin with the substantially horizontally extending p+-diffused region 32, and an n-diffused region 54 having a depth shallower than the p+-diffused region 52 is formed to extend over the side surface and the bottom surface of the trench 48 and to adjoin with the substantially horizontally extending n-diffused region 14B. Thus, the pn junction capacitor formed between the p+-diffused regions 32 and 52 and the n-diffused regions 14B and 54 has a capacitance larger than that of the pn junction capacitor formed between the substantially horizontally extending p+- and n-diffused regions 32 and 14B shown in FIG. 1, by a pn junction formed on the side wall of the trench 48.

Thereafter, as seen from FIG. 8, a charge storage electrode 56, a capacitor insulator 58, and a capacitor electrode 60 are sequentially formed. Then, an upper level interlayer insulator 62 is formed and a contact hole is formed at position corresponding to the n-diffused region 14A. A bit line 64 is formed on the upper level interlayer insulator 62 to contact the n-diffused region 14A through the contact hole formed in the lower level and upper level interlayer insulators 20 and 62.

As seen from FIG. 8, a center portion of the stacked capacitor is folded to extend or enter into the trench 48. In other words, the stacked capacitor shown in FIG. 8 has a capacitance larger than the stacked capacitor shown in FIG. 1, by an amount corresponding to double the depth of the trench 48, namely an area of the side surface of the trench 48. Therefore, the structure shown in FIG. 8 is very effective in minimizing the memory cell size.

The invention has thus been shown and described with reference to the specific disclosed embodiments. However, it should be noted that the present invention is in no way limited to the details of the illustrated structures, but rather, changes and modifications may be made within the scope of the appended claims.

I claim:

1. A method of manufacturing a semiconductor memory which comprises:
   at least one memory cell which includes an insulated gate field effect transistor and an associated stacked capacitor which are formed close to each other on a single substrate of a first conduction type,
   the insulated gate field effect transistor having a source and a drain which are located separately from each other in the single substrate and are formed by impurity regions of a second conduction type opposite to the first conduction type,
   the insulated gate field effect transistor also having a gate formed by a gate insulator on a region between the source and the drain,
   the gate and the source of the insulated gate field effect transistor being connected to a word line and a bit line, respectively,
   the drain of the insulated gate field effect transistor being connected to a first electrode of the stacked capacitor,
   a first impurity region of the first conduction type having a higher impurity concentration than that of the substrate, formed in the substrate below the stacked capacitor, and
   a second impurity region of the second conduction type formed above the first impurity region in the substrate below the stacked capacitor and which has a junction depth shallower than the depth of the first impurity region, so that a pn junction is formed between the first impurity region and the second impurity region,
   the second impurity region being connected to the first electrode of the stacked capacitor, whereby the memory cell has a cell capacitance based on a sum of a capacitance of the stacked capacitor and a junction capacitance of the pn junction,
   an upper portion of said second impurity region being substantially contiguous to said gate insulator,
   wherein a trench, having sidewalls which define opposite sides of the trench and having a bottom, is formed into the substrate under the stacked capacitor, said sidewalls being substantially perpendicular to the substrate, and the stacked capacitor extends into the trench, thereby increasing the capacitance of the stacked capacitor, and
   the first impurity region of the first conduction type and the second impurity region of the second conduction type are respectively formed to completely surround the sidewalls on the opposite sides and to extend under the bottom of the trench, the first and second impurity regions thus being substantially aligned with the trench, so that the pn junction between the first impurity region and the second impurity region completely surrounds the sidewalls and extends under the bottom of the trench from one side of the trench to the other,
   the method including the step of forming a first conduction type impurity ion diffused layer and a second conduction type impurity ion diffused layer formed thereon, in said substrate in a substrate portion where said stack capacitor is formed, said first conduction type impurity ion diffused layer and said second conduction type impurity ion diffused layer being substantially in parallel to said substrate, forming said trench substantially perpendicular to said substrate in said substrate portion so as to penetrate through said first conduction type impurity layer to reach a substrate portion under said first conduction type impurity layer;
   implanting impurity ions of the first conduction type under a first acceleration energy so as to form the portion of the first impurity region completely surrounding the sidewalls, with a rotating inclined ion implantation in which the substrate is inclined at an angle of substantially 10° to 15° in relation to a direction perpendicular to a direction of an ion beam, and the substrate is rotated; and implanting impurity ions of the second conduction type under a second acceleration energy lower than the first acceleration energy, so as to form the portion of the second impurity region completely surrounding the sidewalls, with a rotating inclined ion implantation in which the substrate is inclined at an angle of substantially 10° to 15° in relation to a direction perpendicular to a direction of an ion beam and the substrate is rotated.

2. A method as claimed in claim 1 wherein the drain of the insulated gate field effect transistor is continuous to and integral with the second impurity region.

3. A method as claimed in claim 1 wherein the first impurity region has an impurity concentration higher than that of the substrate.

* * * * *